(12) United States Patent
Walker (10) Patent No.: US 7,113,001 B2
(45) Date of Patent: Sep. 26, 2006

(54) CHIP TO CHIP INTERFACE

(75) Inventor: Robert Walker, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 1 day.

(21) Appl. No.: 10/730,445

(22) Filed: Dec. 8, 2003

(65) Prior Publication Data

US 2005/0122135 A1   Jun. 9, 2005

(51) Int. Cl.
*H03K 19/175* (2006.01)
(52) U.S. Cl. .............................. 326/86; 326/90; 326/38
(58) Field of Classification Search .................. 326/21, 326/30, 83, 86, 90; 327/108–112
See application file for complete search history.

(56) References Cited

U.S. PATENT DOCUMENTS

| | | | |
|---|---|---|---|
| 5,936,429 A * | 8/1999 | Tomita | 326/82 |
| 6,151,648 A | 11/2000 | Haq | |
| 6,160,423 A | 12/2000 | Haq | |
| 6,255,859 B1 | 7/2001 | Haq | |
| 6,327,205 B1 | 12/2001 | Haq | |
| 6,356,105 B1 * | 3/2002 | Volk | 326/30 |
| 6,430,606 B1 | 8/2002 | Haq | |
| 6,472,904 B1 * | 10/2002 | Andrews et al. | 326/38 |
| 6,513,080 B1 | 1/2003 | Haq | |
| 6,570,406 B1 * | 5/2003 | Tang et al. | 326/86 |
| 6,600,347 B1 * | 7/2003 | Borkenhagen et al. | 327/112 |
| 2002/0003436 A1 * | 1/2002 | Andrews et al. | 326/40 |
| 2004/0155690 A1 * | 8/2004 | Andrews et al. | 327/276 |
| 2004/0207544 A1 * | 10/2004 | Choi | 341/56 |

\* cited by examiner

*Primary Examiner*—Vibol Tan
(74) *Attorney, Agent, or Firm*—Dicke, Billig & Czaja, PLLC (57) ABSTRACT

A chip to chip interface comprises a driver configured to provide a first signal in response to a change in first data at one edge of a clock signal and a second signal in response to a change in second data at another edge of the clock signal. The chip to chip interface comprises a receiver configured to receive the first signal and the second signal and toggle a first bit in response to the first signal and toggle a second bit in response to the second signal.

25 Claims, 6 Drawing Sheets

CHIP TO CHIP INTERFACE

BACKGROUND

The need for high speed input/output (I/O) continues to increase as clock speeds increase. I/O transfers between chips on printed circuit boards (PCBs) are becoming increasingly fast. As clock speeds increase, high speed I/O becomes more difficult to realize due to shrinking bit times and set up and hold times not scaling well.

Typical I/O uses at least two lines to transfer data from one chip to another. One line is for the data signal and the other line is for a data strobe or data clock signal. Both the data signal and the data strobe or data clock signal are transmitted simultaneously from one chip to another through the two lines. At the receiving chip, the data strobe or data clock signal is used to latch in the data bits from the data signal. Skew between the data signal and the data strobe or data clock signal increases the difficulty of transmitting data at high speeds. Skew and other factors across the I/O can dramatically reduce the valid data eye to 50% or less of the data bit time.

In a typical data bus, data is transferred continuously requiring constant power to drive both the data signal and the data clock or data strobe signal. In addition, the data line and the data strobe or data clock line must be routed precisely to avoid skew problems. Some designs need more data clock or data strobe lines as the data bus gets wider. In addition, adjacent data bits in the data bus may be switching in different directions during a half cycle of the data clock, which can cause crosstalk issues and simultaneous switching issues. The bits that are switching in typical I/O are held at ground or full power, which also increases crosstalk issues.

I/O can also suffer from a lone pulse problem. A lone pulse problem occurs when there are a series of logic low data bits or a series of logic high data bits and at one point in the series a single bit having the opposite logic level is transmitted. When this occurs, the opposite logic level data bit can be missed as the logic level of the data line may have been pulled too high or too low by the preceding multiple logic high bits or multiple logic low bits. A single bit of the opposite logic level may not overcome the threshold logic level required to characterize the bit. These problems become more common and troublesome as I/O speeds increase.

SUMMARY

One aspect of the present invention provides a chip to chip interface. The chip to chip interface comprises a driver configured to provide a first signal in response to a change in first data at one edge of a clock signal and a second signal in response to a change in second data at another edge of the clock signal. The chip to chip interface comprises a receiver configured to receive the first signal and the second signal and toggle a first bit in response to the first signal and toggle a second bit in response to the second signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
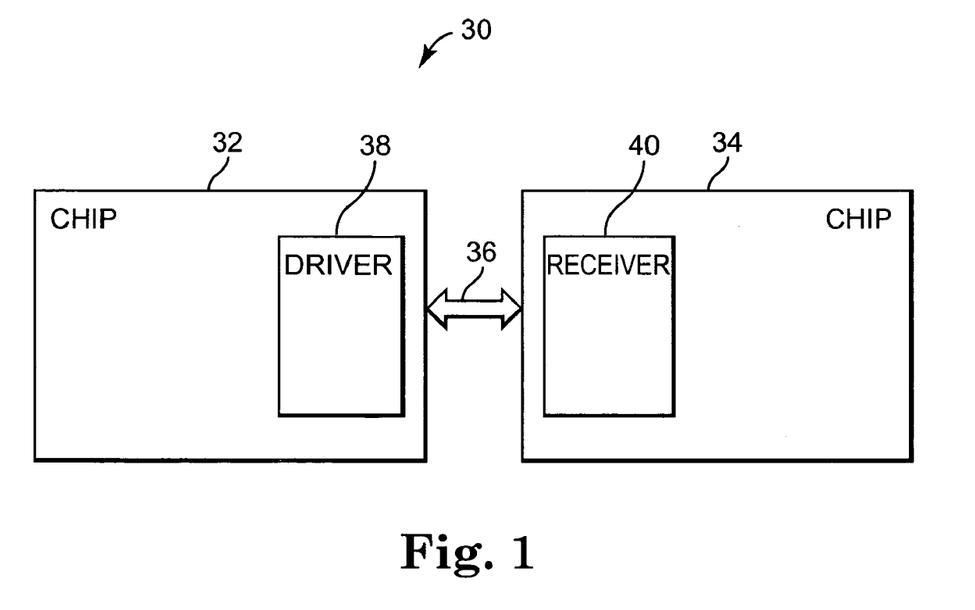
FIG. 1 is a block diagram illustrating one embodiment of a chip to chip interface.

FIG. 1 is a block diagram illustrating one embodiment of a chip to chip interface 30. Chip to chip interface 30 includes chip 32 and chip 34. Chip 32 is electrically coupled to chip 34 through communication link 36. Chip 32 includes driver 38 and chip 34 includes receiver 40. In one embodiment, chip 32 is a memory controller and chip 34 is a memory, such as a double data rate synchronous dynamic random access memory (DDR SDRAM). In other embodiments, chip 32 and chip 34 can be any two suitable chips that transmit signals between each other.

Driver 38 transmits signals to receiver 40 through communication link 36. In one embodiment, driver 38 receives a double data rate (DDR) data signal to transmit to receiver 40. The DDR data signal includes positive edge data aligned with positive edges of a clock signal and negative edge data aligned with negative edges of the clock signal. The positive edge data is referred to as even data and the negative edge data is referred to as odd data.

Communication link 36 includes one or more individual signal lines. Driver 38 transmits signals to receiver 40 through communication link 36 by providing a first signal in response to a change in positive edge data and providing a second signal in response to a change in negative edge data.

The first signal supplied in response to a change in positive edge data is received by receiver 40 and a first bit in receiver 40 toggles in response to the first signal. The second signal supplied in response to a change in negative edge data is received by receiver 40 and a second bit in receiver 40 toggles in response to the second signal. The first bit represents the positive edge data from the DDR data signal in driver 38 and the second bit represents the negative edge data from the DDR data signal in driver 38. The DDR data signal is not transmitted over communication link 36. Rather, communication link 36 is used to toggle a first bit and a second bit in receiver 40 in response to a change in the positive edge or negative edge data in the DDR data signal in driver 38.

In one embodiment, the clock signal is a 1 GHz clock signal and the DDR data signal is a 2 Gbit DDR data signal. In another embodiment, the clock signal is a 1.6 GHz clock signal and the DDR data signal is a 3.2 Gbit DDR data signal.

Figure 2:
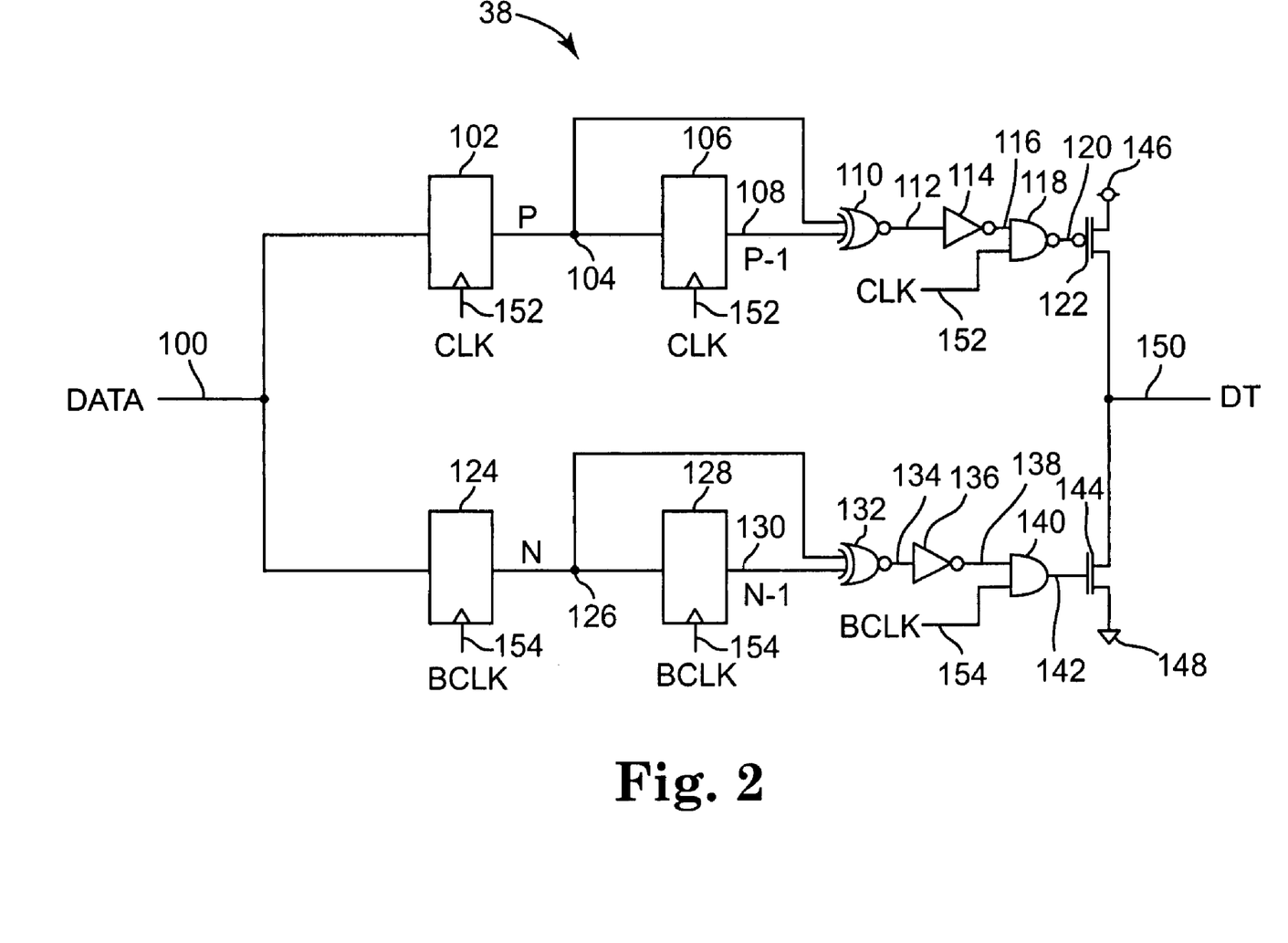
FIG. 2 is a diagram illustrating one embodiment of a driver for the chip to chip interface.

FIG. 2 is a diagram illustrating one embodiment of driver 38. Driver 38 includes flip-flop 102, flip-flop 106, XNOR gate 110, inverter 114, NAND gate 118, and transistor 122. Driver 38 also includes flip-flop 124, flip-flop 128, XNOR gate 132, inverter 136, AND gate 140, and transistor 144. In one embodiment, transistor 122 is a p-channel metal oxide semiconductor (PMOS) field effect transistor (FET) and transistor 144 is an n-channel metal oxide semiconductor (NMOS) FET. In one embodiment flip-flops 102, 106, 124, and 128 are positive edge triggered D-type flip-flops or other suitable latches.

Input DATA signal path 100 is electrically coupled to the data input of flip-flop 102 and the data input of flip-flop 124. The clock (CLK) signal path 152 is electrically coupled to the clock input of flip-flop 102. The output of flip-flop 102 is electrically coupled to the data input of flip-flop 106 and a first input of XNOR gate 110 through positive edge data (P) signal path 104. The CLK signal path 152 is electrically coupled to the clock input of flip-flop 106. The output of flip-flop 106 is electrically coupled to a second input of XNOR gate 110 through previous positive edge data (P−1) signal path 108. The output of XNOR gate 110 is electrically coupled to the input of inverter 114 through signal path 112. The output of inverter 114 is electrically coupled to a first input of NAND gate 118 through signal path 116. A second input of NAND gate 118 is electrically coupled to the CLK signal path 152. The output of NAND gate 118 is electrically coupled to the gate of transistor 122 through signal path 120. One side of the drain-source path of transistor 122 is electrically coupled to supply voltage 146 and the other side of the drain-source path of transistor 122 is electrically coupled to the data transmitted (DT) signal path 150.

The clock input of flip-flop 124 is electrically coupled to the inverted CLK (BCLK) signal path 154. The output of flip-flop 124 is electrically coupled to the data input of flip-flop 128 and a first input of XNOR gate 132 through negative edge data (N) signal path 126. The BCLK signal path 154 is electrically coupled to the clock input of flip-flop 128. The output of flip-flop 128 is electrically coupled to a second input of XNOR gate 132 through previous negative edge data (N−1) signal path 130. The output of XNOR gate 132 is electrically coupled to the input of inverter 136 through signal path 134. The output of inverter 136 is electrically coupled to a first input of AND gate 140 through signal path 138. A second input of AND gate 140 is electrically coupled to the BCLK signal path 154. The output of AND gate 140 is electrically coupled to the gate of transistor 144 through signal path 142. One side of the drain-source path of transistor 144 is electrically coupled to DT signal path 150 and the other side of the drain-source path of transistor 144 is electrically coupled to reference voltage 148. In one embodiment, reference voltage 148 is ground.

The input DATA signal on data path 100 is a DDR data stream. Flip-flops 102 and 124 divide the double data rate data stream into positive edge data and negative edge data. On each rising edge of the CLK signal, flip-flop 102 latches the positive edge data bit of the input DATA signal. The P signal output of flip-flop 102 indicates the current positive edge data bit. On each positive edge of the BCLK signal, flip-flop 124 latches the negative edge data bit of the input DATA signal. The N signal output of flip-flop 124 indicates the current negative edge data bit.

Flip-flop 106 latches the P signal output from flip-flop 102 on each rising edge of the CLK signal. The output P−1 signal of flip-flop 106 indicates the previous positive edge data bit. The XNOR gate 110 exclusively nors the P and P−1 signals. The output of XNOR gate 110 is a logic low if one of P and P−1 is logic high and the other of P and P−1 is logic low. The output of XNOR gate 110 is logic high if P and P−1 are both logic high or both logic low. The output from the XNOR gate 110 is inverted through inverter 114. The output from inverter 114 is input to NAND gate 118 along with the CLK signal. If the output of NAND gate 118 is logic low, transistor 122 turns on and the supply voltage 146 pulls the DT signal to a logic high. If the output of NAND gate 118 is logic high, transistor 122 turns off and the drain-source path of transistor 122 becomes high impedance. Each change in the positive edge data from a logic low to a logic high or from a logic high to a logic low results in transistor 122 turning on and driving the DT signal on path 150 to a logic high.

Flip-flop 128 latches the N signal output from flip-flop 124 on each rising edge of the BCLK signal. The output N−1 signal of flip-flop 128 indicates the previous negative edge data bit. The XNOR gate 132 exclusively nors the N and N−1 signals. The output of XNOR gate 132 is a logic low if one of N and N−1 is logic high and the other of N and N−1 is logic low. The output of XNOR gate 132 is logic high if N and N−1 are both logic high or both logic low. The output from XNOR gate 132 is inverted through inverter 136. The output from inverter 136 is input to AND gate 140 along with the BCLK signal. If the output of AND gate 140 is logic high, transistor 144 turns on and the reference voltage 148 pulls the DT signal to a logic low. If the output of AND gate 140 is logic low, transistor 144 turns off and the drain-source path of transistor 144 becomes high impedance. Each change in the negative edge data from a logic low to a logic high or from a logic high to a logic low results in transistor 144 turning on and driving the DT signal on path 150 to a logic low.

In operation, if the P and P−1 signals are both logic high or both logic low, the output of inverter 114 is at a logic low and the output of NAND gate 118 provides a logic high to the gate of transistor 122. Transistor 122 is turned off (non-conducting) and the drain-source path of transistor 122 is high impedance. If the P and P−1 signals are at opposite logic levels, the output of inverter 144 is logic high and the output of NAND gate 118 provides a logic low if the CLK signal is also at a logic high. The logic low provided to the gate of transistor 122 pulls the DT signal to a logic high for a half cycle of the CLK signal while the CLK signal is logic high. For positive edge bit stream data, a logic high pulse is generated each time a positive edge bit changes from a zero to a one or from a one to a zero.

If the N and N−1 signals are both logic high or both logic low, the output of inverter 136 is at a logic low and the output of NAND gate 140 provides a logic low to the gate of transistor 144. Transistor 144 is turned off and the drain-source path of transistor 144 is high impedance. If the N and N−1 signals are at opposite logic levels, the output of inverter 136 is at a logic high. The output of NAND gate 140 provides a logic high if the BCLK signal is also at a logic high. The logic high provided to the gate of transistor 144 pulls the DT signal to a logic low for a half cycle of the BCLK signal while the BCLK signal is logic high. For negative edge bit stream data, a logic low pulse is generated each time a negative edge bit changes from a zero to a one or from a one to a zero. If neither a logic high pulse nor a logic low pulse is generated, the DT signal remains at the termination voltage of signal path 150.

Figure 3:
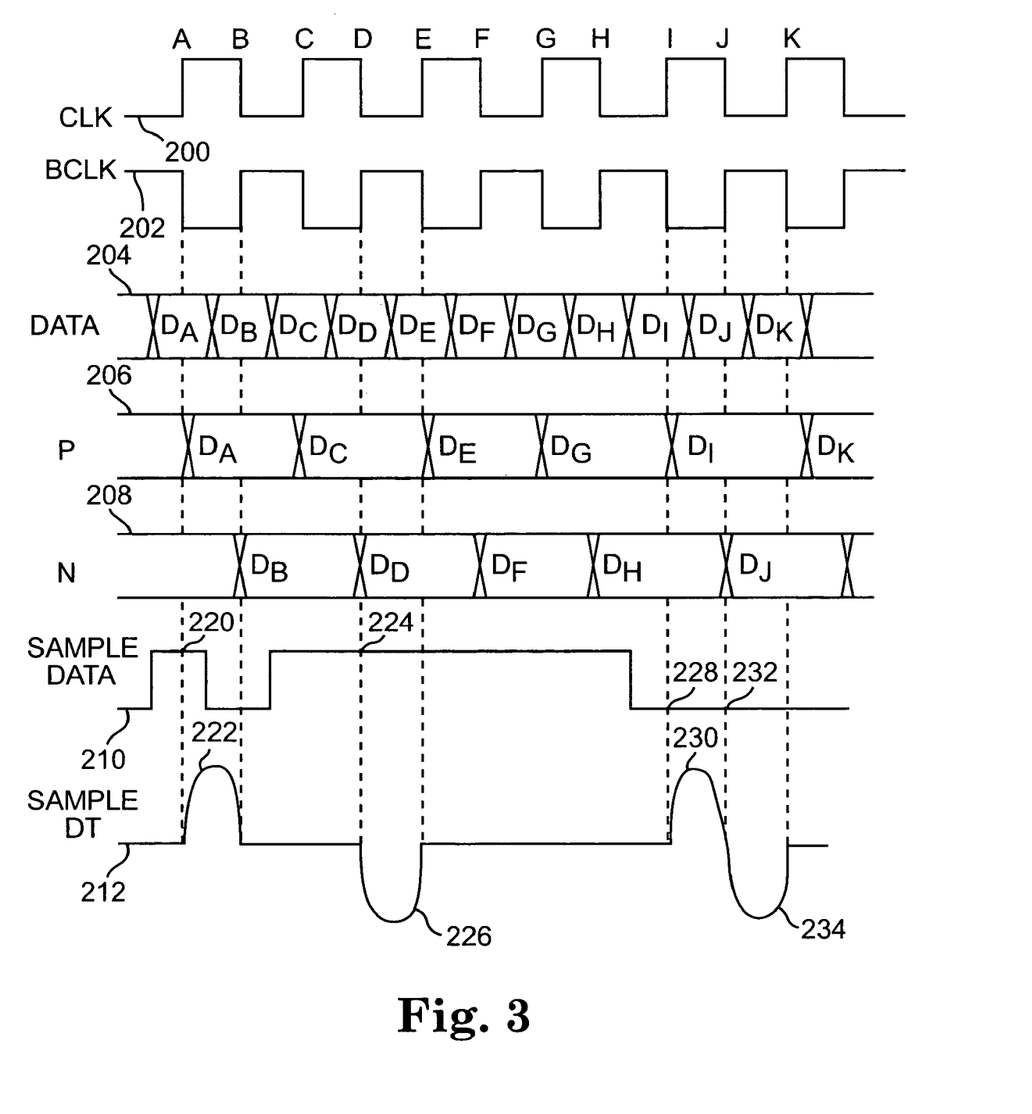
FIG. 3 is a timing diagram illustrating the timing of signals for the driver for the chip to chip interface.

FIG. 3 is a timing diagram illustrating the timing of signals in driver 38. The timing diagram includes CLK signal 200 on signal path 152, BCLK signal 202 on signal path 154, DATA signal 204 on signal path 100, P signal 206 on signal path 104, N signal 208 on signal path 126, a sample data signal 210 for input on signal path 100, and a sample data transmitted (DT) signal 212 on signal path 150.

The CLK signal 200 includes clock edges A–K. Rising or positive edges of the CLK signal 200 are indicated at A, C, E, G, I, and K. Falling or negative edges of the CLK signal 200 are indicated at B, D, F, H, and J. The BCLK signal 202 is the inverse of CLK signal 200. The DATA signal 204 is a double data rate data stream. Double data rate data signal 204 is divided into positive bit stream data and negative bit stream data. The positive bit stream data is defined as the data that is latched in at the positive edges of CLK signal 200 and includes $D_A$, $D_C$, $D_E$, $D_G$, $D_I$, and $D_K$. The negative bit stream data is defined as the data that is latched in at the negative edges of CLK signal 200 and includes $D_B$, $D_D$, $D_F$, $D_H$, and $D_J$.

Flip-flop 102 latches in the positive bit stream data on each positive edge of CLK signal 200. The output of flip-flop 102, indicated at P signal 206, includes $D_A$, $D_C$, $D_E$, $D_G$, $D_I$, and $D_K$. Flip-flop 124 latches in the negative bit stream data on each positive edge of BCLK signal 202. The output of flip-flop 124, indicated at N signal 208, includes $D_B$, $D_D$, $D_F$, $D_H$, and $D_J$.

Each change in the positive bit stream data, P signal 206, from a logic low to a logic high or from a logic high to a logic low, pulls the output DT signal to a logic high though transistor 122 and supply voltage 146. Each change in the negative bit stream data, N signal 208, from a logic low to a logic high or from a logic high to a logic low, pulls the output DT signal to a logic low through transistor 144 and reference voltage 148. For each change in the positive bit stream data, the output DT signal is pulled to a logic high to supply a logic high pulse for a half cycle of CLK signal 200. For each change in the negative bit stream data, the output DT signal is pulled to a logic low to supply a logic low pulse for a half cycle of BCLK signal 202.

Sample data signal 210 illustrates an example of a DDR data signal on path 100. Sample data signal 210 includes $D_A$=logic high, $D_B$=logic low, $D_C$–$D_H$=logic high, and $D_I$–$D_K$=logic low. As sample data signal 210 is input on signal path 100 into driver 38, sample DT signal 212 is output from driver 38 on signal path 150. To begin, flip-flops 102, 106, 124, and 128 are reset to output logic lows. At CLK signal edge A, a logic high DA of sample data 210 is latched into flip-flip 102 at 220. This pulls sample DT signal 212 to a logic high at 222 for a half cycle of CLK signal 200 between CLK signal edges A and B. At CLK signal edge B, a logic low $D_B$ is supplied and there is no change in the negative bit stream data, such that sample DT signal 212 remains at the termination voltage of signal path 150. At positive CLK signal edges C, E, and G, a logic high is supplied and there is no change in the positive bit stream data and no logic high pulses are generated in DT signal 212.

At negative CLK signal edge D, the negative bit stream data changes from a logic low to a logic high. Logic high $D_D$ of sample data signal 210 is latched into flip-flop 124 at 224. This pulls sample DT signal 212 to a logic low at 226 for a half cycle of BCLK signal 202 between CLK signal edges D and E. At negative CLK signal edges F and H, a logic high is supplied and there is no change in the negative bit stream data and no logic low pulses are generated in DT signal 212.

At CLK signal edge I, the positive bit stream data changes from a logic high to a logic low. Logic low $D_I$ of sample data signal 210 is latched into flip-flop 102 at 228. This pulls sample DT signal 212 to a logic high at 230 for a half cycle of CLK signal 200 between CLK signal edges I and K. At CLK signal edge J, the negative bit stream data changes from a logic high to a logic low. Logic low $D_J$ is latched into flip-flop 124 at 232, which pulls sample DT signal 212 to a logic low at 234 for a half cycle of BCLK signal 202 between CLK signal edges J and K.

Figure 4:
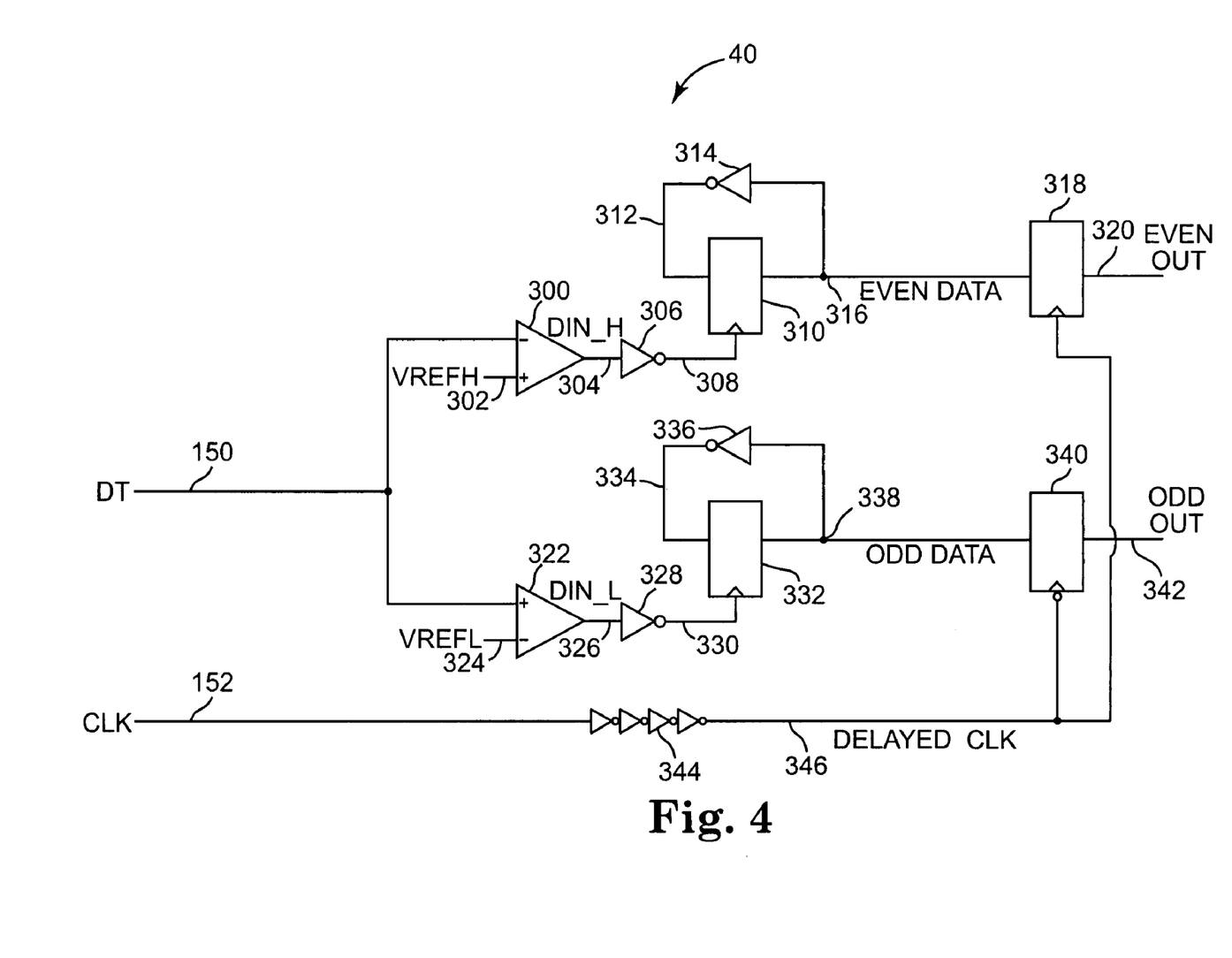
FIG. 4 is a diagram illustrating one embodiment of a receiver for the chip to chip interface.

FIG. 4 is a diagram illustrating one embodiment of receiver 40. Receiver 40 includes operational amplifier (op amp) 300, inverter 306, flip-flop 310, inverter 314, and flip-flop 318. Receiver 40 also includes op amp 322, inverter 328, flip-flop 332, inverter 336, flip-flop 340, and delay chain 344. In one embodiment, flip-flops 310, 318, and 332 are positive edge triggered D-type flip-flops or other suitable latches and flip-flop 340 is a negative edge triggered D-type flip-flop or other suitable latch.

DT signal path 150 is electrically coupled to the negative input of op amp 300 and the positive input of op amp 322. VREFH signal path 302 is electrically coupled to the positive input of op amp 300. The output of op amp 300 is electrically coupled to the input of inverter 306 through data in high (DIN_H) signal path 304. The output of inverter 306 is electrically coupled to the clock input of flip-flop 310 through signal path 308. The output of flip-flop 310 is electrically coupled to the input of inverter 314 and to the data input of flip-flop 318 through EVEN DATA signal path 316. The output of inverter 314 is electrically coupled to the data input of flip-flop 310 through signal path 312. The output of flip-flop 318 is electrically coupled to EVEN OUT signal path 320. The clock input of flip-flop 318 is electrically coupled to the output of inverter chain 344 through delayed CLK signal path 346 and the CLK signal path 152 is electrically coupled to the input of inverter chain 344.

The VREFL signal path 324 is electrically coupled to the negative input of op amp 322. The output of op amp 322 is electrically coupled to the input of inverter 328 through data in low (DIN_L) signal path 326. The output of inverter 328 is electrically coupled to the clock input of flip-flop 332 through signal path 330. The output of flip-flop 332 is electrically coupled to the input of inverter 336 and to the data input of flip-flop 340 through ODD DATA signal path 338. The output of inverter 336 is electrically coupled to the data input of flip-flop 332 through signal path 334. The output of flip-flop 340 is electrically coupled to ODD OUT signal path 342. The clock input of flip-flop 340 is electrically coupled to the output of inverter delay chain 344 through delayed CLK signal path 346.

Op amp 300 operates as a comparator and receives the DT and VREFH signals as inputs. In one embodiment, VREFH is a constant voltage signal greater than the termination voltage of path 150 and less than the supply voltage 146. If the voltage of the DT signal is greater than the voltage of the VREFH signal, the output DIN_H signal is a logic low. The logic low DIN_H signal is inverted to a logic high by inverter 306. The logic high output of inverter 306 clocks flip-flop 310, which toggles the EVEN DATA signal by latching in the output of inverter 314. If the voltage of the DT signal is less than the voltage of the VREFH signal, the output DIN_H signal is a logic high. The logic high DIN_H signal is inverted to a logic low by inverter 306. The logic low output of inverter 306 does not clock flip-flop 310 and the EVEN DATA signal does not toggle. The EVEN DATA signal is latched into flip-flop 318 on the rising edge of the delayed CLK signal. Flip-flop 318 provides the EVEN OUT data signal on path 320 to other circuits in chip 34.

Op amp 322 operates as a comparator and receives the DT and VREFL signals as inputs. In one embodiment, VREFL is a constant voltage signal less than the termination voltage of path 150 and greater than the reference voltage 148. If the voltage of the DT signal is less than the voltage of the VREFL signal, the output DIN_L signal is a logic low. The logic low DIN_L signal is inverted to a logic high by inverter 328. The logic high output of inverter 328 clocks flip-flop 332, which toggles the ODD DATA signal by latching in the output of inverter 336. If the voltage of the DT signal is greater than the voltage of the VREFL signal, the output DIN_L signal is a logic high. The logic high DIN_L signal is inverted to a logic low by inverter 328. The logic low output of inverter 328 does not clock flip-flop 332 and the ODD DATA signal does not toggle. The ODD DATA signal is latched into flip-flop 340 on the falling edge of the delayed CLK signal. Flip-flop 340 provides the ODD OUT data signal on path 342 to other circuits in chip 34.

Figure 5:
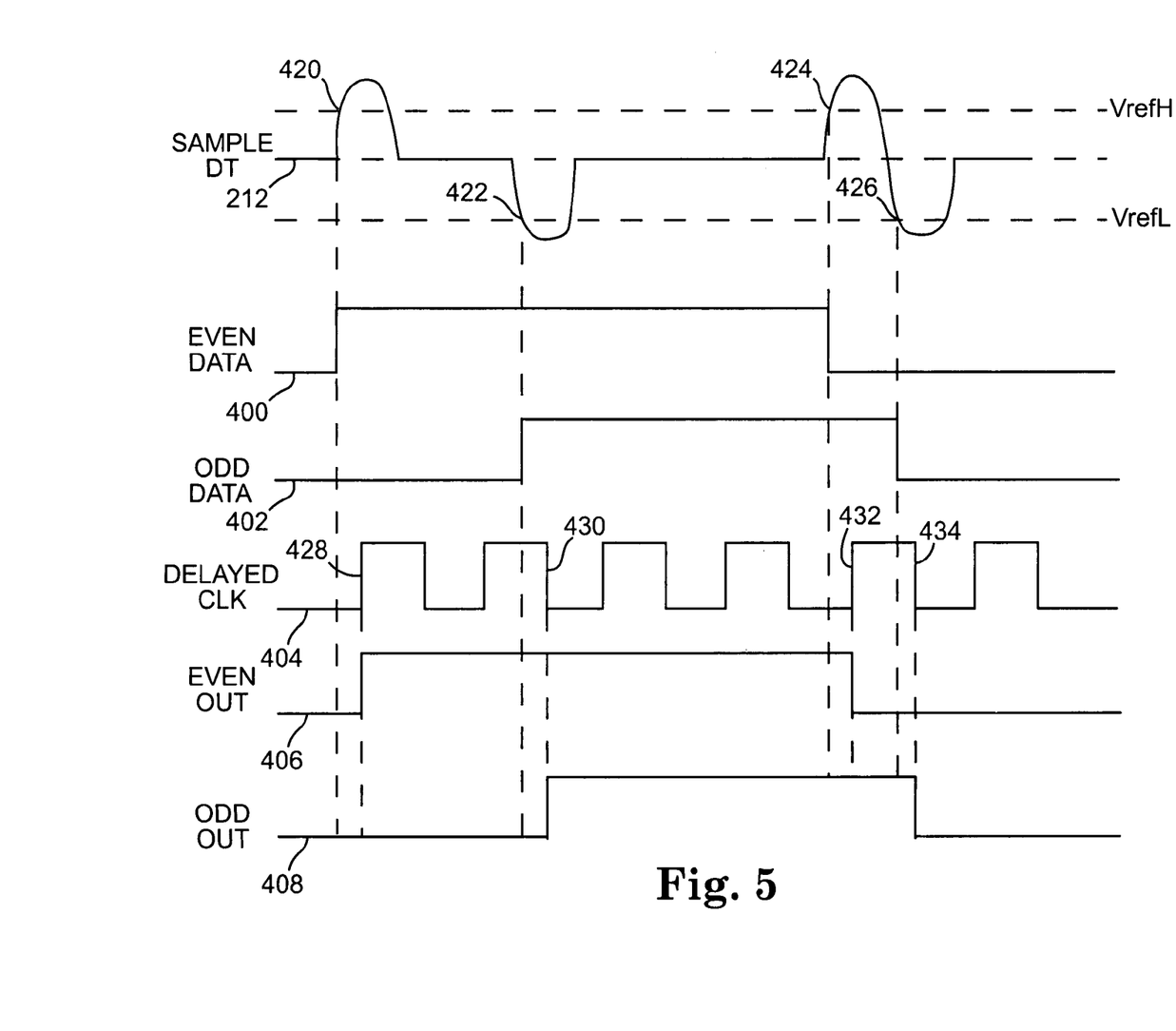
FIG. 5 is a timing diagram illustrating the timing of signals for the receiver for the chip to chip interface.

FIG. 5 is a timing diagram illustrating the timing of signals for receiver 40. The timing diagram includes sample DT signal 212 on signal path 150, EVEN DATA signal 400 on signal path 316, ODD DATA signal 402 on signal path 338, delayed CLK signal 404 on signal path 346, EVEN OUT signal 406 on signal path 320, and ODD OUT signal 408 on signal path 342.

To begin, flip-flops 308, 320, 332, and 340 are reset to logic low level outputs. As sample DT signal 212 rises above VREFH at 420 at op amp 300, EVEN DATA signal 400 toggles from a logic low to a logic high. As delayed CLK signal 404 transitions from a logic low to a logic high at 428, the logic high EVEN DATA signal 400 is latched into flip-flop 318 to change the EVEN OUT signal 406 from a logic low to a logic high.

As sample DT signal 212 falls below VREFL at 422 at op amp 322, ODD DATA signal 402 toggles from a logic low to a logic high. As delayed CLK signal 404 transitions from a logic high to a logic low at 430, the logic high ODD DATA signal 402 is latched into flip-flop 340 to change the ODD OUT signal 342 from a logic low to a logic high.

As sample DT signal 212 rises above VREFH at 424, indicating a change in the positive bit stream data, EVEN DATA signal 400 toggles from a logic high to a logic low. As delayed CLK signal 404 transitions from a logic low to a logic high at 432, the logic low EVEN DATA signal 400 is latched into flip-flop 318 to change the EVEN OUT signal 406 from a logic high to a logic low. As sample DT signal 212 falls below VREFL at 426, indicating a change in the negative bit stream data, ODD DATA signal 402 toggles from a logic high to a logic low. As delayed CLK signal 404 transitions from a logic high to a logic low at 434, the logic low ODD DATA signal 402 is latched into flip-flop 340 to change the ODD OUT signal 408 from a logic high to a logic low.

Therefore, the positive edge data and negative edge data signals in driver 38 are recreated as EVEN OUT signal 406 on path 320 and ODD OUT signal 408 on path 342. The double data rate data is transferred from chip 32 to chip 34 by toggling bits in receiver 40.

Figure 6:
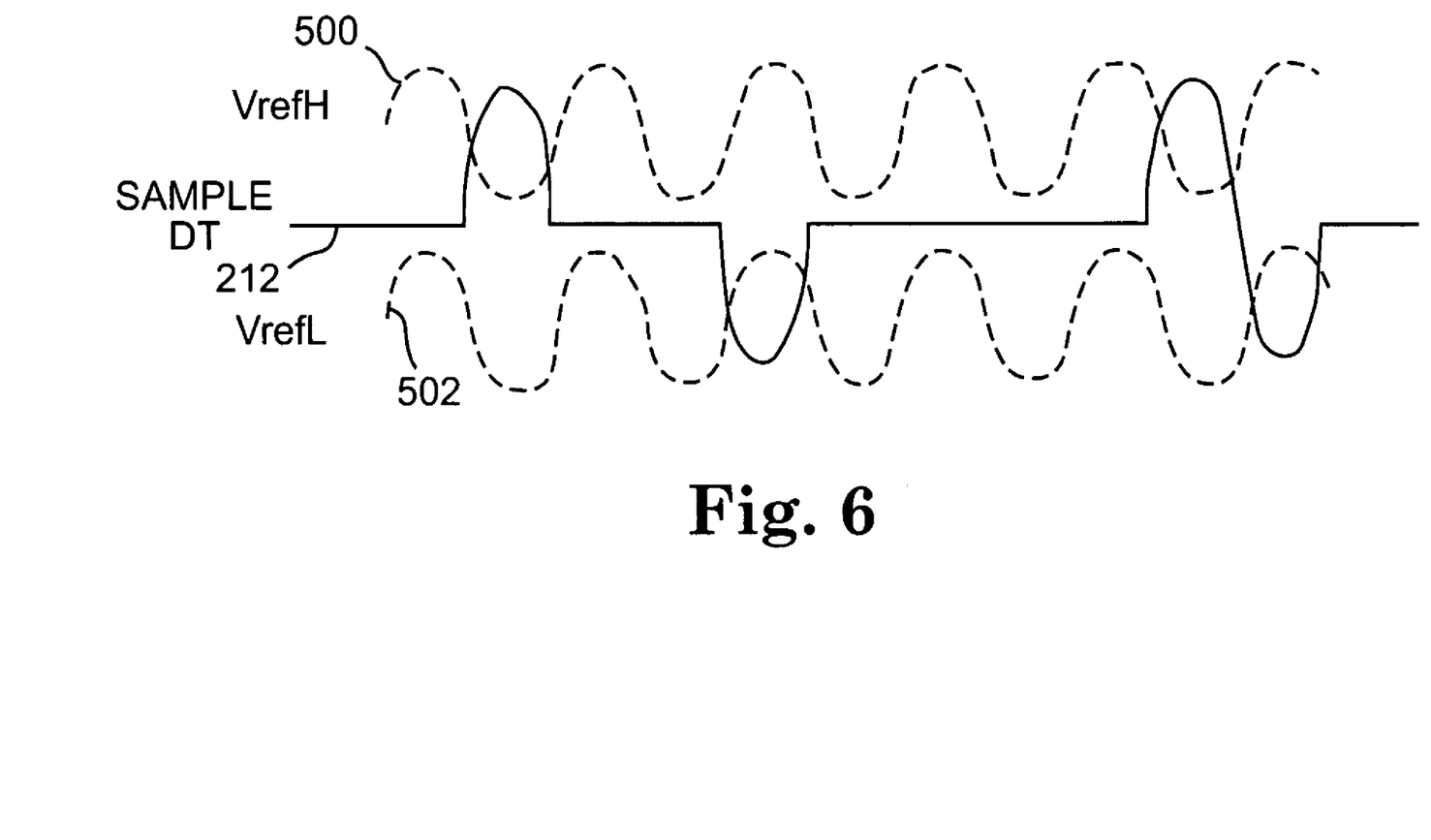
FIG. 6 is a timing diagram illustrating the timing of a sample signal with sinusoidal reference low and reference high signals.

FIG. 6 is a timing diagram illustrating sample DT signal 212 and another embodiment of a VREFH signal 500 and a VREFL signal 502. VREFH signal 500 and VREFL signal 502 are sinusoidal. In this embodiment, the use of sinusoidal signals for VREFH signal 500 and VREFL signal 502 in place of constant reference voltages increases the voltage difference between the sample DT signal 212 and the reference signals. This results in a quicker and more reliable comparison of the DT signal to the reference signals in op amps 300 and 322 as the reference signals transition opposite the DT signal.

What is claimed is:

1. A chip to chip interface comprising:
    a driver configured to provide a first signal in response to a change in even data in a double data rate data stream and a second signal in response to a change in odd data in the double data rate data stream;
    a receiver configured to receive the first signal and the second signal and toggle a first bit in response to the first signal and toggle a second bit in response to the second signal,
    wherein the receiver comprises a first comparator configured to toggle the first bit and a second comparator configured to toggle the second bit.

2. The chip to chip interface of claim 1, wherein the receiver is configured to provide the first bit to represent the even data and to provide the second bit to represent the odd data.

3. The chip to chip interface of claim 1, wherein the even data is positive edge data in the double data rate data stream.

4. The chip to chip interface of claim 1, wherein the odd data is negative edge data in the double data rate data stream.

5. The chip to chip interface of claim 1, wherein the receiver is configured to provide the first bit to a circuit at each positive edge of a clock signal.

6. The chip to chip interface of claim 1, wherein the receiver is configured to provide the second bit to a circuit at each negative edge of a clock signal.

7. The chip to chip interface of claim 1, wherein the first signal is a high voltage pulse.

8. The chip to chip interface of claim 1, wherein the second signal is a low voltage pulse.

9. A chip to chip interface comprising:
    a driver configured to provide a first signal in response to a change in first data at one edge of a clock signal and a second signal in response to a change in second data at another edge of the clock signal; and
    a receiver configured to receive the first signal and the second signal and toggle a first bit in response to the first signal and toggle a second bit in response to the second signal;
    wherein the driver is configured to provide the first signal in one portion of the clock signal and the second signal in another portion of the clock signal; and
    wherein the receiver comprises a first comparator configured to toggle the first bit and a second comparator configured to toggle the second bit.

10. The chip to chip interface of claim 9, wherein the one portion is one half cycle of the clock signal and the second portion is another half cycle of the clock signal.

11. A chip to chip interface comprising:
    a driver configured to provide a first signal in response to a change in first data at one edge of a clock signal and a second signal in response to a change in second data at another edge of the clock signal; and
    a receiver configured to receive the first signal and the second signal and toggle a first bit in response to the first signal and toggle a second bit in response to the second signal,
    wherein the driver is configured to compare current first data to previous first data and supply the first signal in response to a difference between the current first data and the previous first data.

12. The chip to chip interface of claim 11, wherein the previous first data is supplied one clock cycle before the current first data.

13. A memory interface comprising:
    a memory controller comprising a driver configured to provide a first signal in response to a change in even data in a double data rate data stream and a second signal in response to a change in odd data in the double data rate data stream; and
    a memory comprising a receiver configured to receive the first signal and the second signal and toggle a first bit in response to the first signal and toggle a second bit in response to the second signal,
    wherein the receiver comprises a first comparator configured to toggle the first bit and a second comparator configured to toggle the second bit.

14. A chip to chip communication bus comprising:
a driver configured to receive a double data rate data signal and provide a high voltage pulse in response to a change in even data and to provide a low voltage pulse in response to a change in odd data; and
a receiver configured to receive the high voltage pulse and the low voltage pulse and toggle a first bit in response to the high voltage pulse and toggle a second bit in response to the low voltage pulse,
wherein the receiver comprises a first comparator configured to toggle the first bit and a second comparator configured to toggle the second bit.

15. The chip to chip communication bus of claim 14, wherein the receiver is configured to provide the first bit at a rising edge of a clock signal and the second bit at a negative edge of the clock signal to recreate the double data rate data signal.

16. A chip to chip communication bus comprising:
a driver configured to receive a double data rate data signal and provide a high voltage pulse in response to a change in positive edge data and to provide a low voltage pulse in response to a change in negative edge data; and
a receiver configured to receive the high voltage pulse and the low voltage pulse and toggle a first bit in response to the high voltage pulse and toggle a second bit in response to the low voltage pulse,
wherein the double data rate data signal is a 3.2 Gbit double data rate data signal.

17. A chip to chip communication bus comprising:
a driver configured to receive a double data rate data signal and provide a high voltage pulse in response to a change in positive edge data and to provide a low voltage pulse in response to a change in negative edge data; and
a receiver configured to receive the high voltage pulse and the low voltage pulse and toggle a first bit in response to the high voltage pulse and toggle a second bit in response to the low voltage pulse,
wherein the double data rate data signal is a 2 Gbit double data rate data signal.

18. A chip to chip communication bus comprising:
a driver configured to receive a double data rate data signal and provide a high voltage pulse in response to a change in positive edge data and to provide a low voltage pulse in response to a change in negative edge data; and
a receiver configured to receive the high voltage pulse and the low voltage pulse and toggle a first bit in response to the high voltage pulse and toggle a second bit in response to the low voltage pulse,
wherein the receiver comprises a first comparator configured to toggle the first bit and a second comparator configured to toggle the second bit, and wherein the first comparator receives a first reference signal to compare to the high voltage pulse and the second comparator receives a second reference signal to compare to the low voltage pulse.

19. The chip to chip communication bus of claim 18, wherein the first reference signal comprises a first constant voltage and the second reference signal comprises a second constant voltage.

20. The chip to chip communication bus of claim 18, wherein the first reference signal and the second reference signal comprise sinusoidal signals.

21. A chip to chip interface comprising:
means for providing a first signal in response to a change in even data in a double data rate data stream;
means for providing a second signal in response to a change in odd data in a double data rate data stream;
means for receiving the first signal and toggling a first bit based on a comparison of the first signal to a first reference voltage; and
means for receiving the second signal and toggling a second bit based on a comparison of the second signal to a second reference voltage.

22. A method for communicating data between chips comprising:
generating a first signal in a first chip in response to a change in even data in a double data rate data stream;
generating a second signal in the first chip in response to a change in odd data in the double data rate data stream;
passing the first signal and the second signal from the first chip to a second chip;
toggling a first bit in the second chip based on a comparison of the first signal to a first reference voltage; and
toggling a second bit in the second chip based on a comparison of the second signal to a second reference voltage.

23. The method of claim 22, wherein passing the first signal and the second signal from the first chip to the second chip comprises passing the first signal and the second signal from the first chip to the second chip through a single signal path.

24. A method of claim 22, comprising setting the first bit and the second bit to initial values.

25. The method of claim 22, comprising providing the first bit to a circuit in the second chip on each rising edge of a clock signal and providing the second bit to the circuit on each falling edge of the clock signal.

* * * * *